United States Patent
King et al.

(10) Patent No.: US 6,352,908 B1
(45) Date of Patent: Mar. 5, 2002

(54) METHOD FOR REDUCING NITRIDE RESIDUE IN A LOCOS ISOLATION AREA

(75) Inventors: Wei-Sheng King, Taipei; Tso-Chun Tony Wang, Taichung, both of (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/519,732

(22) Filed: Mar. 3, 2000

(51) Int. Cl.$^7$ .................. H01L 21/336; H01L 21/76
(52) U.S. Cl. ...................... 438/439; 438/297
(58) Field of Search ................. 438/439, 297

(56) References Cited

U.S. PATENT DOCUMENTS

| | | | |
|---|---|---|---|
| 5,369,052 A | * 11/1994 | Kenkare et al. | |
| 5,371,035 A | * 12/1994 | Pfiester et al. | |
| 5,453,397 A | * 9/1995 | Ema et al. | |
| 5,612,247 A | * 3/1997 | Itabashi | |
| 5,891,788 A | * 4/1999 | Fazan et al. | |
| 5,910,018 A | * 6/1999 | Jang | |
| 5,970,364 A | * 10/1999 | Huang et al. | |

* cited by examiner

Primary Examiner—John F. Niebling
Assistant Examiner—Ron Pompey
(74) Attorney, Agent, or Firm—Chien-Wei (Chris) Chou; Oppenheimer Wolff & Donnelly LLP

(57) ABSTRACT

A method of forming an isolation structure includes the steps of: providing a silicon substrate; forming an upper pad oxide layer superjacent a top surface of the substrate, and a lower pad oxide layer subjacent a bottom surface of the substrate; forming a nitride masking layer superjacent the upper pad oxide layer, and a lower pad silicon nitride layer subjacent the lower pad oxide layer; patterning and etching the nitride masking layer to expose a portion of the upper pad oxide layer; applying a first etching solution to the exposed portion of the upper pad oxide layer to expose a portion of the substrate substantially defining the boundaries of an active area, and simultaneously forming an undercut cavity by removing a portion of the upper pad oxide layer under the exposed edges of the nitride masking layer surrounding the exposed portion of the substrate; performing an oxidation process to form an etching stop layer over the exposed portion of the substrate and in the undercut cavity, the oxidation process also forming an upper thin oxide layer over the nitride masking layer, and a lower thin oxide layer subjacent the lower pad silicon nitride layer; and applying a second etching solution to substantially remove the upper thin oxide layer and the lower thin oxide layer for the purpose of eliminating the occurrence of silicon nitride residual after the performance of subsequent processing steps.

14 Claims, 4 Drawing Sheets

METHOD FOR REDUCING NITRIDE RESIDUE IN A LOCOS ISOLATION AREA

BACKGROUND OF THE INVENTION

1. Field of the Invention

The present invention relates generally to a method of forming an isolation region in a semiconductor device, and more specifically to a method of reducing nitride residue in a LOCOS isolation area.

2. Description of the Prior Art

As semiconductor device dimensions are decreased, and device density increases, it becomes more difficult to efficiently and reliably fabricate isolation structures for separating active areas of the device. One common method of forming isolation structures for semiconductor devices is referred to as local oxidation process (LOCOS isolation process). The area formed via such a process is referred to as LOCOS isolation area.

Figure 1A:
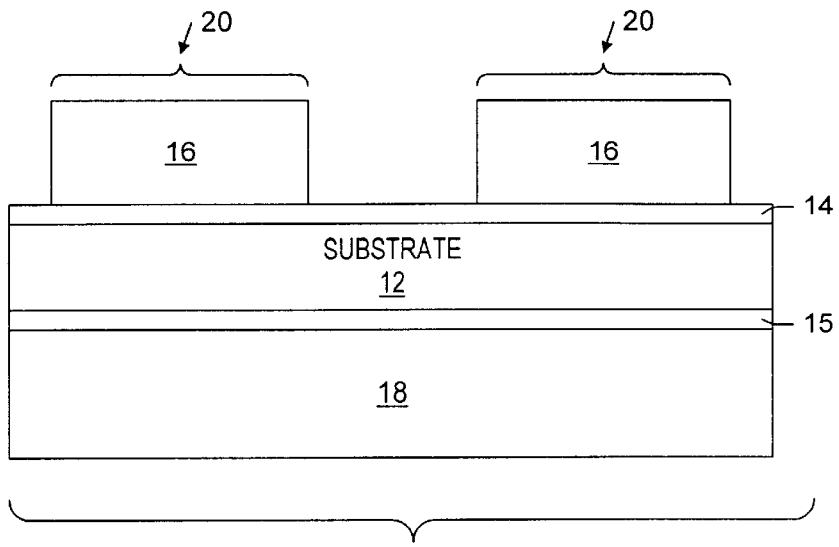

FIGS. 1A through 1E illustrate cross-sectional views of an integrated circuit as formed during sequential steps of a prior art LOCOS based method of forming a field oxide isolation region. Referring to FIG. 1A, a silicon substrate 12 having a top surface and a bottom surface is provided. An upper pad oxide layer 14 is formed superjacent the top surface of the substrate 12, and a lower pad oxide layer 15 is formed subjacent the bottom surface of the substrate 12. An upper pad silicon nitride layer 16 is formed superjacent the upper pad oxide layer 14, and a lower pad silicon nitride layer 18 is formed subjacent the lower pad oxide layer 15. The upper and lower pad oxide layers 14 and 15 are used to provide improved adhesion between the substrate 12 and the upper and lower pad silicon nitride layers 16 and 18 respectively. Next, forming a photo resistive mask over the upper pad silicon nitride layer 16, the mask defining an intended active area 20. A lithography process is performed to remove a portion of the upper pad silicon nitride layer 16 thereby exposing a portion of the upper pad oxide layer 14 including the intended active area 20.

Figure 1B:
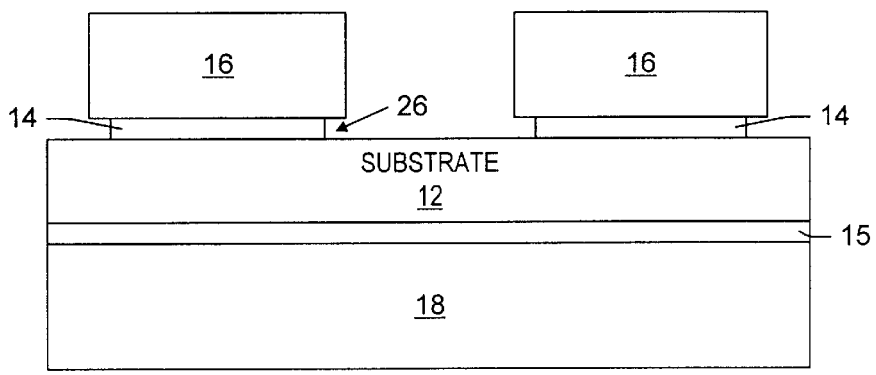

Referring to FIG. 1B, the upper surface of the integrated circuit is subjected to an etching solution, such as a hydrofluoric acid solution (HF), to remove the exposed portion of the upper pad oxide layer 14 thereby exposing a portion of the upper surface of the substrate 12, and forming an undercut cavity 26 by removing a portion of the upper pad oxide layer 14 under the exposed edges of the remaining portion of the upper pad silicon nitride layer 16

Figure 1C:
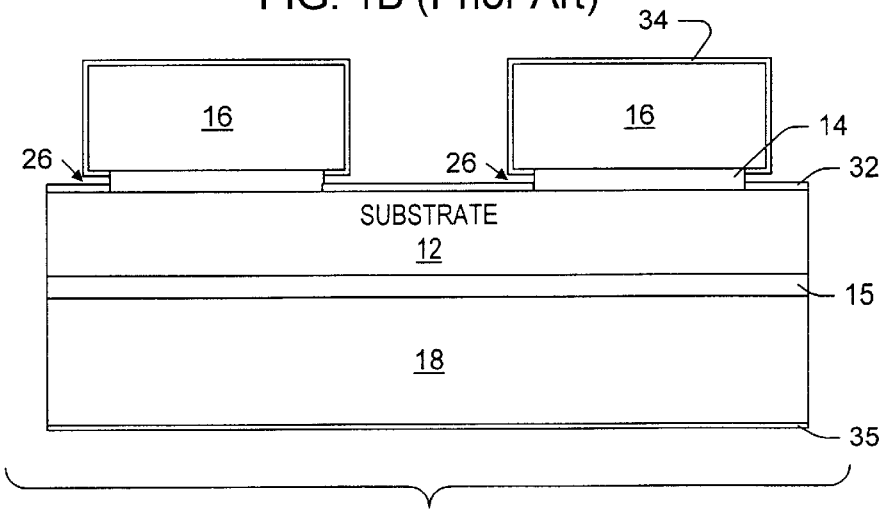

Referring to FIG. 1C, an oxide layer, or etching stop layer, 32 is formed on the exposed portion of the upper surface of the substrate 12 and in the cavities 26. The etching stop layer 32 is typically formed in accordance with a thermal oxidation process. During the thermal oxidation process for forming the etching stop layer 32, an upper thin oxide layer 34 is incidentally formed superjacent the remaining portion of the upper pad silicon nitride layer 16, and a lower thin oxide layer 35 is incidentally formed subjacent the lower pad silicon nitride layer 18. The incidental formation of the upper and lower thin oxide layers 34 and 35 occurs because the ratio of the oxidation rate of silicon to the oxidation rate of silicon nitride is approximately 25:1. Therefore, during the thermal oxidation process to form several Angstroms of the etching stop layer 32, oxidation also occurs on the surfaces of the remaining portion of the upper pad silicon nitride layer 16 and the surfaces of the lower pad silicon nitride layer 18 thereby forming the upper and lower thin oxide layers 34 and 35. The thin oxide layers 34 and 35 are typically formed to have a thickness which ranges between several Angstroms and tens of Angstroms, that is between approximately 1 and 100 Angstroms.

Figure 1D:
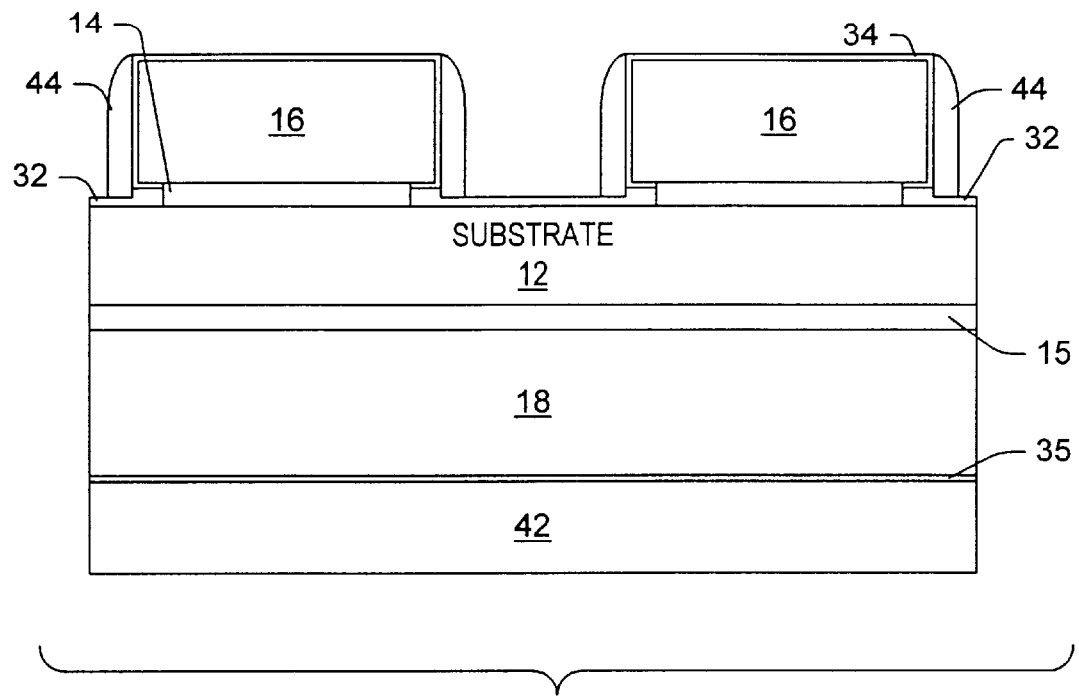

Referring to FIG. 1D, a low pressure chemical vapor deposition (LPCVD) process is performed to deposit: a lower silicon nitride layer 42 subjacent the lower thin oxide layer 35; and an upper silicon nitride layer (not shown) superjacent the remaining portion of the upper pad silicon nitride layer 16 and superjacent the etching stop layer 32. Subsequently, a anisotropic etching process is performed on the upper silicon nitride layer to form silicon nitride spacers 44 adjacent the thin oxide layers 34 coated on the sidewalls of the remaining portion of the upper pad silicon nitride layer 16.

Figure 1E:
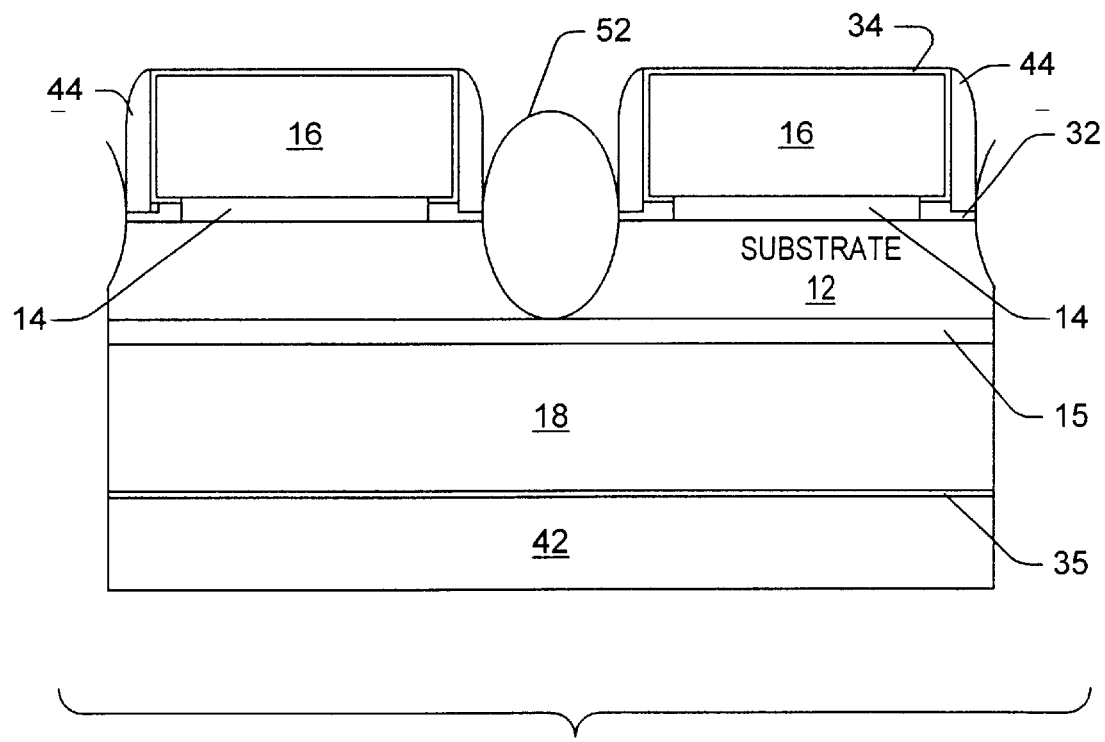

Referring to FIG. 1E, the remaining portion of the upper silicon nitride layer 16 and silicon nitride spacers 45 are used as a mask during an oxidation process to form a field oxide area 52. Subsequent steps of the prior art LOCOS based method of forming a field oxide isolation region include: removing the silicon nitride spacers 44, the remaining portion of the upper pad silicon nitride layer 16, the remaining portion of the upper pad oxide layer 14, and the lower silicon nitride layer 42; as well as forming and removing a sacrificial layer (not shown) to define an active area.

There are several problems associated with the prior art LOCOS based method of forming a field oxide isolation area. The thin oxide layers 34 and 35, which have a thickness of several Angstroms, cause problems in subsequent removal steps including removing the silicon nitride spacers 44, the remaining portion of the upper pad silicon nitride layer 16, and the remaining portion of the upper pad oxide layer 14. Conventionally, silicon nitride can be removed by applying a high temperature phosphoric acid solution. However, the phosphoric acid solution has a high selectivity in removing silicon nitride and oxide (the ratio is typically 40:1), and so the thin oxide layers 34 and 35 are not removed as quickly as the silicon nitride layers. Therefore the lower thin oxide layer 35, which forms a barrier between the lower pad silicon nitride layer 18 and the silicon nitride layer 42, impedes removal of the lower pad silicon nitride layer 18. Because the silicon nitride layer 42 cannot be efficiently removed by application of the phosphoric acid solution, a silicon nitride residue remains after the subsequent removal steps. Also, the required period of time of applying the phosphoric acid solution to remove the silicon nitride is long which can cause manufacturing delays. Furthermore, the silicon nitride residue causes photo leveling issues in etching speed drifting.

What is needed is an improved LOCOS based method of forming a field oxide isolation region wherein silicon nitride residue is substantially eliminated.

What is also needed is an improved LOCOS based method of forming a field oxide isolation region wherein it is not necessary to apply phosphoric acid solution for an excessive amount of time during steps of removing silicon nitride.

SUMMARY OF THE INVENTION

It is an object of the present invention to provide an improved LOCOS based method of forming a field oxide isolation region wherein silicon nitride residue is substantially eliminated.

It is another object of the present invention to provide an improved LOCOS based method of forming a field oxide isolation region wherein it is not necessary to apply phosphoric acid solution for an excessive amount of time during steps of removing silicon nitride.

Briefly, a presently preferred embodiment of the present invention provides an improved method of forming an isolation structure including the steps of: providing a silicon substrate having a top surface and a bottom surface; forming an upper pad oxide layer superjacent the top surface of the substrate, and a lower pad oxide layer subjacent the bottom surface of the substrate; forming a nitride masking layer superjacent the upper pad oxide layer, and a lower pad silicon nitride layer subjacent the lower pad oxide layer; patterning and etching the nitride masking layer to expose a portion of the upper pad oxide layer; applying a first etching solution to the exposed portion of the upper pad oxide layer to expose a portion of the substrate substantially defining the boundaries of an active area; performing an oxidation process to form an etching stop layer over the exposed portion of the substrate, the oxidation process also forming an upper thin oxide layer over the nitride masking layer, and a lower thin oxide layer subjacent the lower pad silicon nitride layer; applying a second etching solution to substantially remove the upper thin oxide layer and the lower thin oxide layer; forming a silicon nitride spacer around said nitride masking layer via lithography process; and performing an oxidation process to form a field oxide around said nitride masking layer to define an active area.

Further steps of the method of forming an isolation structure include: forming an upper silicon nitride layer over the etching stop layer and over the exposed nitride masking layer; forming a lower silicon nitride layer subjacent the lower pad silicon nitride layer; removing portions of the upper silicon nitride layer to expose a top surface of the nitride masking layer, and a central portion of the etching stop layer in the active region, and leaving a silicon nitride spacer adjacent the exposed edges of the nitride masking layer; and forming a field oxide in the active region.

The step of forming a lower silicon nitride layer subjacent the lower pad silicon nitride layer includes performing a chemical vapor deposition process (CVD process). The step of forming a field oxide in the active region includes performing a thermal oxidation process using the silicon nitride spacer and the nitride masking layer as a mask. An important advantage of the LOCOS based method of forming a field oxide isolation region according to the present invention is that silicon nitride residue is substantially eliminated.

Another advantage of the LOCOS based method of forming a field oxide isolation region according to the present invention is that it is not necessary to apply phosphoric acid solution for an excessive amount of time during steps of removing silicon nitride.

The foregoing and other objects, features, and advantages of the present invention will be apparent from the following detailed description of the preferred embodiment which makes reference to the several figures of the drawing.

IN THE DRAWING

FIGS. 1A through 1E are cross-sectional views illustrating a progression of manufacturing steps in accordance with a prior art LOCOS based method of forming a field oxide isolation region; and FIGS. 2A through 2F are cross-sectional views illustrating a progression of manufacturing steps in accordance with an improved LOCOS based method of forming a field oxide isolation region in accordance with the present invention.

DETAILED DESCRIPTION OF THE PREFERRED EMBODIMENTS

FIGS. 2A through 2F are cross-sectional views illustrating a progression of manufacturing steps in accordance with an improved LOCOS based method of forming a field oxide isolation region in accordance with the present invention.

Figure 2A:
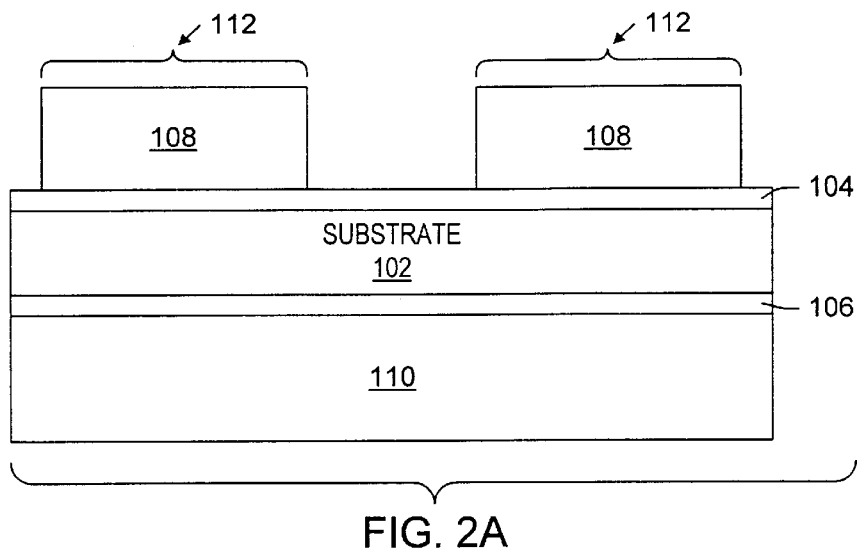

Referring to FIG. 2A, a silicon substrate 102 (e.g., a silicon wafer) having a top surface and a bottom surface is provided. An upper pad oxide layer 104 is formed superjacent the top surface of the substrate 102, and a lower pad oxide layer 106 is formed subjacent the bottom surface of the substrate 102. An upper pad silicon nitride layer 108 is formed superjacent the upper pad oxide layer 104, and a lower pad silicon nitride layer, 110 is formed superjacent the lower pad oxide layer 106. The upper and lower pad oxide layers 104 and 106 are used to provide improved adhesion between the silicon substrate 102 and the upper and lower pad silicon nitride layers 108 and 110 respectively.

Next, a photo resistive mask is formed over the upper pad silicon nitride layer 108, the mask defining the intended active area 112 of the substrate 102. A lithography process is performed to remove a portion of the upper pad silicon nitride layer 108 thereby exposing a portion of the upper pad oxide layer 104 including an intended active area 112.

Figure 2B:
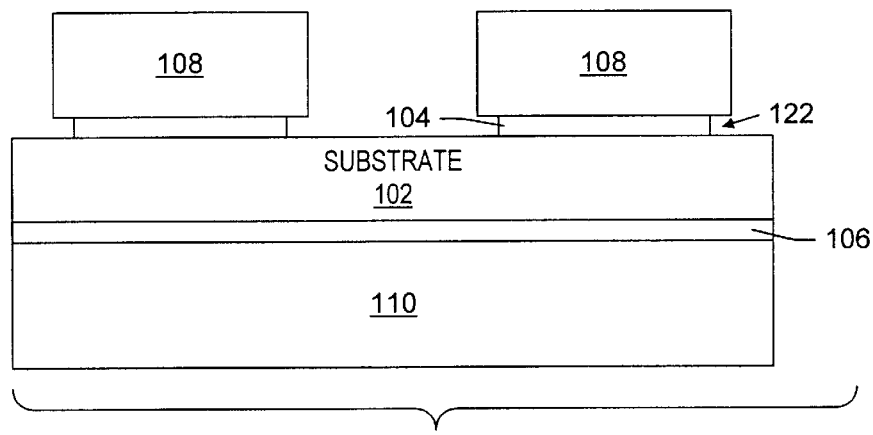

Referring to FIG. 2B, a first etching solution is applied to the upper pad oxide layer 104 in order to remove the exposed portion of the upper pad oxide layer 104 thereby exposing a portion of the upper surface of the substrate 102, and simultaneously forming an undercut cavity 122 by removing a portion of the upper pad oxide layer 104 under the exposed edges of the upper pad silicon nitride layer 108. In one embodiment of the present invention, the first etching solution is a hydrofluoric acid (HF) solution having a concentration of approximately 5%.

Figure 2C:
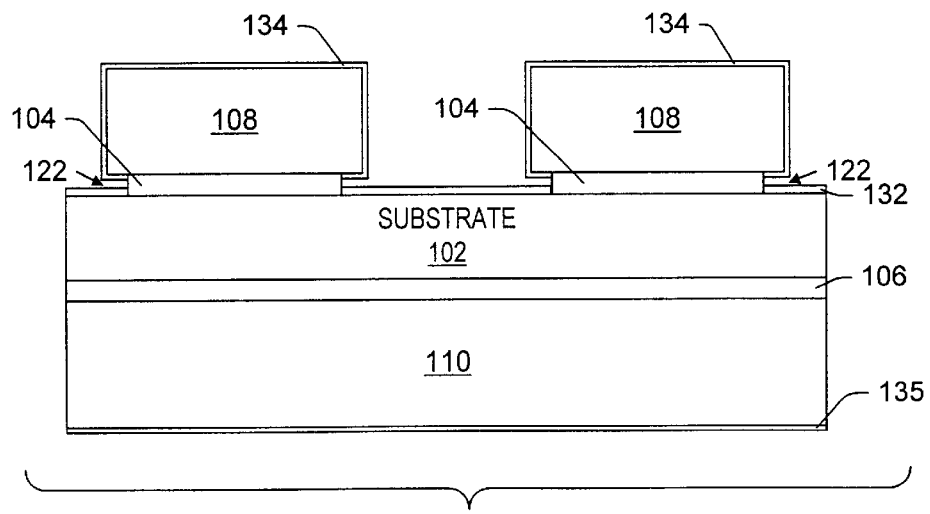

Referring to FIG. 2C, an oxide layer 132, functioning as an etching stop layer, is formed on the exposed portion of the upper surface of the substrate 102 and in the undercut cavities 122. Preferably, the etching stop layer 132 is formed by performing a thermal oxidation process using a large volume of oxygen.

Note that the ratio of the oxidation rate of silicon to the oxidation rate of silicon nitride is 25:1. Therefore, in the course of the thermal oxidation process for forming the etching stop layer 132, a small amount of oxidation also occurs on the lower surface of the lower pad silicon nitride layer 110 and on the surface of the upper pad silicon nitride layer 108. As a result, a lower thin oxide layer 135 is formed subjacent the lower pad silicon nitride layer 110, and an upper thin oxide layer 134 is formed superjacent the upper pad silicon nitride layer 108.

As mentioned above, a problem arises in subsequent lithography and etching processes if the upper and lower thin oxide layers 134 and 135 are not removed. The thin oxide layers 134 and 135 form barriers which interfere with subsequent lithography and etching steps for removing silicon nitride layers including the remaining portion of the upper pad silicon nitride layer 108. Also, as mentioned, this can cause silicon nitride residue to remain on the back side of the wafer after the performance of subsequent processing steps.

Figure 2D:
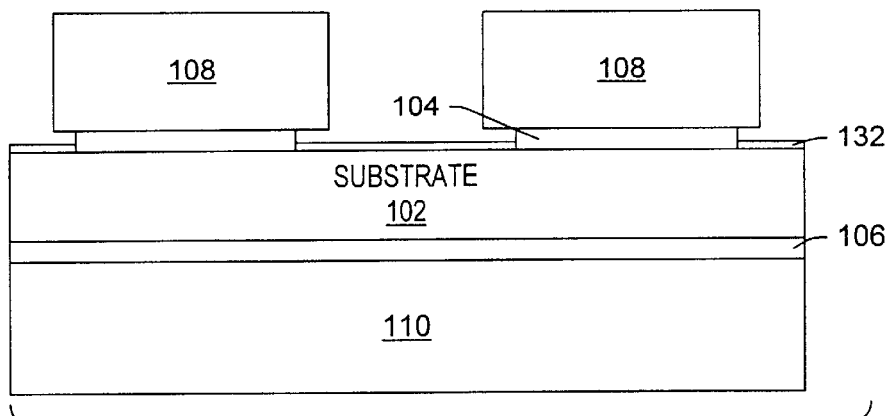

Referring to FIG. 2D, a second etching solution is applied to remove the upper and lower thin oxide layers 134 and 135 in accordance with the present invention in order to avoid the occurrence of silicon nitride residue after the performance of subsequent processing steps including steps for removing the silicon nitride layers. In one embodiment, the second etching solution is a hydrofluoric acid solution (HF solution) having a concentration of approximately 5%.

Figure 2E:
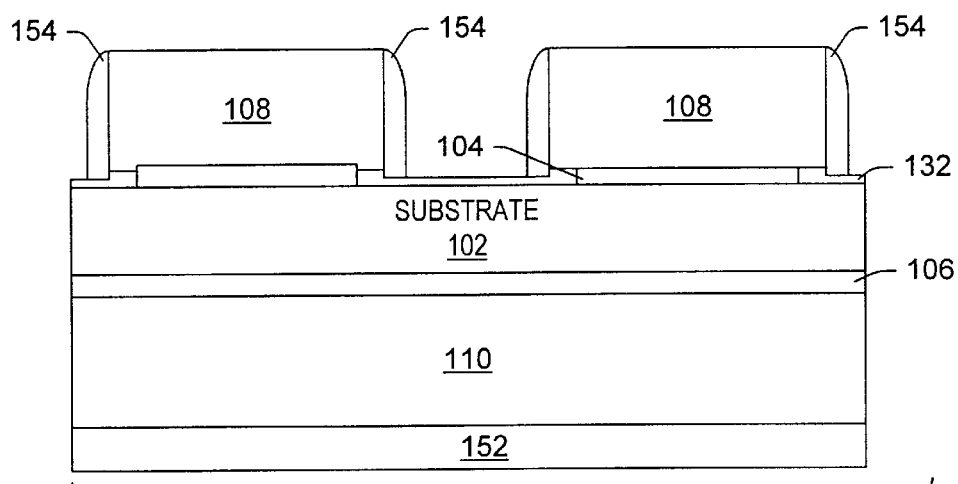

Referring to FIG. 2E, a lower silicon nitride layer 152 is formed subjacent the bottom surface of the lower pad silicon nitride layer 110. Also, an upper silicon nitride layer (not shown) is deposited superjacent the etching stop layer 132 and superjacent the remaining portion of the upper pad silicon nitride layer 108. The step of forming the silicon nitride layer 152 is preferably performed in accordance with a chemical vapor deposition (CVD) process. In one embodiment, a low pressure chemical vapor deposition process (LPCVD process) is performed to deposit the silicon nitride layer 152. In alternative embodiments, the silicon nitride layer 152 is deposited by performing a plasma enhanced chemical vapor deposition (PECVD), or high density plasma CVD.

Subsequently, a lithography process is performed on the upper silicon nitride layer to form silicon nitride spacers 154 adjacent the exposed edges, or sidewalls, of the remaining portions of the upper pad silicon nitride layer 108. In one embodiment, the lithography process for forming the silicon nitride spacers 154 includes anisotropic etching of the upper silicon nitride layer 154 to form the silicon nitride spacers 154.

Figure 2F:
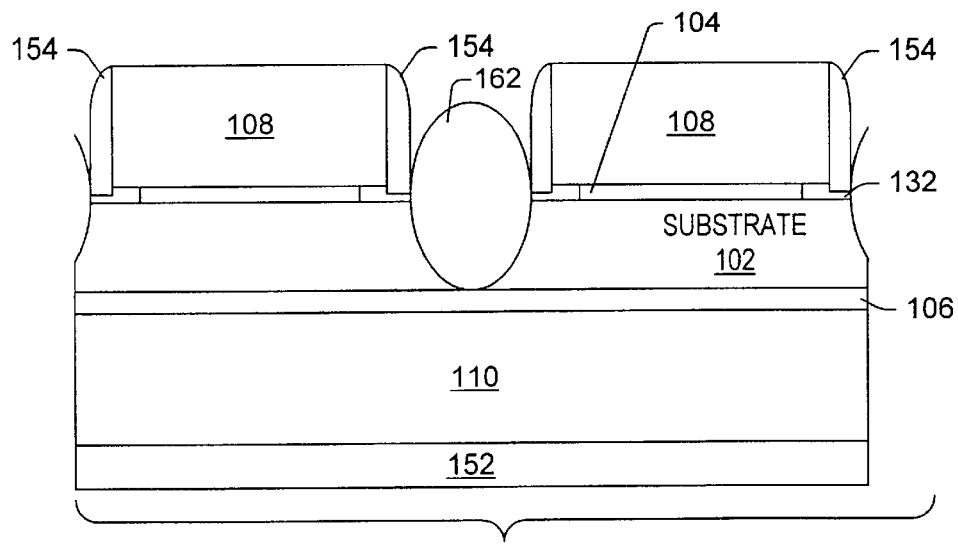

Referring to FIG. 2F, a thermal oxidation process is performed to form a field oxide 162 using the upper pad silicon nitride layer 108 and silicon nitride spacers 154 as a mask.

Subsequent LOCOS process steps include applying a high temperature phosphoric acid solution to remove the silicon nitride spacers 154, the remaining portion of the upper pad silicon nitride layer 108, and the remaining portion of the upper pad oxide layer 104. Additional subsequent processing steps include forming a sacrificial layer (not shown), and removing the sacrificial layer to define an active area.

The LOCOS based method of forming a field oxide isolation region in accordance with the present invention provides several advantages. By removing the upper and lower thin oxide layers 134 and 135 immediately after the etching stop layer is formed, and before the forming of the silicon nitride spacers 154 and silicon nitride layer 152, the occurrence of silicon nitride residue, after the performance of subsequent steps of removing the silicon nitride layers, is substantially reduced. Another advantage of forming the LOCOS isolation area of the present invention is that problems of shifting in lithography and etching processes are alleviated as a result of the elimination of silicon nitride residue after the performance of subsequent steps of removing the silicon nitride layers.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A localized oxidation of silicon (LOCOS) based method of forming an isolation structure comprising the steps of:

providing a substrate having a top surface and a bottom surface;

forming an upper pad oxide layer superjacent said top surface of said substrate, and a lower pad oxide layer subjacent said bottom surface of said substrate;

forming a nitride masking layer superjacent said upper pad oxide layer, and a lower pad silicon nitride layer subjacent said lower pad oxide layer;

patterning and etching said nitride masking layer to expose a portion of said upper pad oxide layer;

applying a first etching solution to the exposed portion of said upper pad oxide layer to expose a portion of said substrate and form an undercut cavity substantially defining the boundaries of an active area, performing an oxidation process to form an etching stop layer over said exposed portion of said substrate and in said undercut cavity, said oxidation process also forming an upper thin oxide layer over said nitride masking layer, and a lower thin oxide layer subjacent said lower pad silicon nitride layer;

applying a second etching solution to substantially remove said upper thin oxide layer and said lower thin oxide layer;

forming a silicon nitride spacer around said nitride masking layer via lithography process; and performing an oxidation process to form a field oxide around said nitride masking layer to define an active area.

2. A LOCOS based method of forming an isolation structure as recited in claim 1 wherein said first etching solution comprises hydrofluoric acid.

3. A LOCOS based method of forming an isolation structure as recited in claim 1 wherein said second etching solution comprises hydrofluoric acid.

4. A LOCOS based method of forming an isolation structure as recited in claim 1 wherein said second etching solution comprises a hydrofluoric acid solution having a concentration of approximately five percent.

5. A LOCOS based method of forming an isolation structure as recited in claim 1 further comprising the steps of:

forming an upper silicon nitride layer over said etching stop layer and over said exposed nitride masking layer;

forming a lower silicon nitride layer subjacent said lower pad silicon nitride layer;

removing portions of said upper silicon nitride layer to expose a top surface of said nitride masking layer, and a central portion of said etching stop layer in said active region, and leaving a silicon nitride spacer adjacent said exposed edges of said nitride masking layer; and forming a field oxide in said active region.

6. A LOCOS based method of forming an isolation structure as recited in claim 5 wherein said step of forming a lower silicon nitride layer subjacent said lower pad silicon nitride layer comprises performing a chemical vapor deposition process.

7. A LOCOS based method of forming an isolation structure as recited in claim 5 wherein said step of forming a lower silicon nitride layer subjacent said lower pad silicon nitride layer comprises performing a low pressure chemical vapor deposition process.

8. A LOCOS based method of forming an isolation structure as recited in claim 5 wherein said step of forming a lower silicon nitride layer subjacent said lower pad silicon nitride layer comprises performing a plasma enhanced chemical vapor deposition process.

9. A LOCOS based method of forming an isolation structure as recited in claim 5 wherein said step of forming a field oxide in said active region includes performing a thermal oxidation process using said silicon nitride spacer and said nitride masking layer as a mask.

10. A LOCOS based method of forming an isolation structure as recited in claim 5 further comprising a step of removing said silicon nitride spacer, said nitride masking layer, and said upper pad oxide layer.

11. A LOCOS based method of forming an isolation structure as recited in claim 10 wherein said step of removing said silicon nitride spacer, said nitride masking layer, and said upper pad oxide layer comprises applying a high temperature phosphoric acid solution.

12. A LOCOS based method of forming an isolation structure as recited in claim 1 wherein said substrate is a silicon substrate.

13. A LOCOS based method of forming an isolation structure as recited in claim 1 wherein said etching stop layer is an oxide layer.

14. A LOCOS based method of forming an isolation structure as recited in claim 1 wherein said etching stop layer is formed by performing a thermal oxidation process using a large volume of oxygen.

\* \* \* \* \*